(12) United States Patent
Rodder et al.

(10) Patent No.: US 10,566,330 B2
(45) Date of Patent: Feb. 18, 2020

(54) DIELECTRIC SEPARATION OF PARTIAL GAA FETS

(71) Applicant: Samsung Electronics Co., Ltd., Suwon-si, Gyeonggi-do (KR)

(72) Inventors: Mark S. Rodder, Dallas, TX (US); Borna J. Obradovic, Leander, TX (US); Dharmendar Palle, Bellevue, WA (US); Rwik Sengupta, Austin, TX (US); Mohammad Ali Pourghaderi, Hwaseong-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 15/977,949

(22) Filed: May 11, 2018

(65) Prior Publication Data
US 2019/0181140 A1    Jun. 13, 2019

Related U.S. Application Data

(60) Provisional application No. 62/597,339, filed on Dec. 11, 2017.

(51) Int. Cl.
| | | |
|---|---|---|
| *H01L 27/092* | (2006.01) | |
| *H01L 29/78* | (2006.01) | |
| *H01L 29/417* | (2006.01) | |
| *H01L 29/66* | (2006.01) | |

(52) U.S. Cl.
CPC .... *H01L 27/0924* (2013.01); *H01L 29/41791* (2013.01); *H01L 29/66795* (2013.01); *H01L 29/785* (2013.01); *H01L 2029/7858* (2013.01)

(58) Field of Classification Search
None
See application file for complete search history.

(56) References Cited

U.S. PATENT DOCUMENTS

| | | | |
|---|---|---|---|
| 6,329,230 B1 | 12/2001 | Matsuda | |
| 7,002,207 B2 * | 2/2006 | Kim ................ | H01L 21/82341 257/331 |
| 8,422,273 B2 * | 4/2013 | Chang ................... | B82Y 10/00 257/24 |
| 8,513,131 B2 | 8/2013 | Cai et al. | |
| 8,659,006 B1 | 2/2014 | Chang et al. | |

(Continued)

FOREIGN PATENT DOCUMENTS

CN    106252352 A    12/2016

*Primary Examiner* — Bilkis Jahan
(74) *Attorney, Agent, or Firm* — Lewis Roca Rothgerber Christie LLP

(57) ABSTRACT

A CMOS system on chip including a series of partial gate-all-around field effect transistors. Each partial GAA FET includes a fin having a stack of channel regions, source and drain regions on opposite sides of the fin, a dielectric separation region including a dielectric material between first and second channel regions, a gate stack on the fin, and a pair of sidewall spacers on opposite sides of the gate stack. A portion of the dielectric separation region has a length from an outer edge of the dielectric separation region to an inner edge of a respective sidewall spacer. The length of the portion of the dielectric separation region of one of the partial GAA FETs is different than the length of the portion of the dielectric separation region of another one of the partial GAA FETs.

20 Claims, 8 Drawing Sheets

(56) References Cited

U.S. PATENT DOCUMENTS

| | | | |
|---|---|---|---|
| 8,778,768 B1 * | 7/2014 | Chang | H01L 29/42392 |
| | | | 257/213 |
| 8,785,981 B1 | 7/2014 | Chang et al. | |
| 9,123,567 B2 | 9/2015 | Radosavljevic et al. | |
| 9,219,119 B2 | 12/2015 | Sun et al. | |
| 9,287,357 B2 | 3/2016 | Rodder et al. | |
| 9,412,816 B2 | 8/2016 | Yang et al. | |
| 9,425,293 B1 | 8/2016 | Balakrishnan et al. | |
| 9,443,949 B1 | 9/2016 | Chang et al. | |
| 9,461,114 B2 | 10/2016 | Obradovic et al. | |
| 9,536,794 B2 | 1/2017 | Chang et al. | |
| 9,647,098 B2 * | 5/2017 | Obradovic | H01L 29/7391 |
| 9,653,537 B1 | 5/2017 | Jagannathan et al. | |
| 9,812,449 B2 | 11/2017 | Obradovic et al. | |
| 9,825,183 B2 * | 11/2017 | Lee | H01L 29/66545 |
| 2006/0240622 A1 * | 10/2006 | Lee | H01L 29/42392 |
| | | | 438/257 |
| 2015/0228480 A1 * | 8/2015 | Yin | H01L 29/00 |
| | | | 438/283 |
| 2016/0027870 A1 * | 1/2016 | Cheng | H01L 29/42356 |
| | | | 257/347 |
| 2017/0200738 A1 | 7/2017 | Kim | |
| 2017/0256544 A1 | 9/2017 | Chai et al. | |

\* cited by examiner

US 10,566,330 B2

DIELECTRIC SEPARATION OF PARTIAL GAA FETS

CROSS-REFERENCE TO RELATED APPLICATION(S)

The present application claims priority to and the benefit of U.S. Provisional Application No. 62/597,339, filed Dec. 11, 2017, the entire content of which is incorporated herein by reference.

FIELD

The present disclosure relates generally to field effect transistors and methods of making the same.

BACKGROUND

Conventional circuits are commonly formed from non-planar "fin" field effect transistors (finFETs). Conventional finFETs generally include multiple vertical fins serving as conducting channel regions. Narrowing the width of the fin channel regions improves gate control of the potential in the fin channel regions. Accordingly, conventional finFETs may be provided with narrow fin widths to reduce short-channel effects and thus enable scaling to shorter gate lengths. However, as gate lengths are scaled, conventional finFETs may fail to provide the desired performance (e.g., $I_{eff}$-$I_{off}$). Additionally, conventional finFETs are not a gate-all-around (GAA) structure, and therefore gate control is only on sides of the fins, which limits further gate length scaling.

Future technologies have contemplated forming circuits from either gate-all-around (GAA) nanowire (NW) FETs or GAA nanosheet (NS) FETs in order to reduce short-channel effects and thereby enable scaling to shorter gate lengths. However, both GAA NW FETs and GAA NS FETs present integration problems. For instance, GAA FETs require an internal spacer to separate the GAA gate metal from the source/drain regions to reduce parasitic capacitance. Additionally, GAA FETs generally require that the GAA gate metal is formed in a narrow vertical region between the bottom of an overlying channel region and the top of an underlying channel region to reduce parasitic capacitance. However, forming the GAA gate metal in a narrow vertical region between the channel regions makes it difficult to achieve the desired threshold voltage ($V_t$).

Additionally, future technologies have contemplated forming circuits from partial GAA NW FETs (also referred to as partial gate-all-around field effect transistors or partial GAA FETs) to reduce short-channel effects. In a conventional CMOS system on chip (SoC) including a series of partial GAA NW FETs, all of the partial GAA NW FETs of the same type have the same length dielectric separation region. That is, in conventional CMOS SoCs, partial GAA NW FETs having different threshold voltage values (e.g., high voltage threshold (HVT), regular voltage threshold (RVT), low voltage threshold (LVT), and super low voltage threshold (SLVT) FETs) all have dielectric separation regions of the same length. Accordingly, these conventional CMOS SoCs including a series of partial GAA NW FETs are not optimized to achieve the highest performance at lowest dynamic power, compatible with cost.

SUMMARY

Aspects of the present disclosure are directed to various embodiments of a CMOS system on chip (SoC). In one embodiment, the CMOS SoC includes a series of partial gate-all-around field effect transistors each including a fin having a stack of channel regions including a first channel region and a second channel region stacked on the first channel region, source and drain regions on opposite sides of the fin, a dielectric separation region including a dielectric material between the first channel region and the second channel region, a gate stack on the fin, and a pair of sidewall spacers on opposite sides of the gate stack. A portion of the dielectric separation region has a length from an outer edge of the dielectric separation region to an inner edge of a respective one of the pair of sidewall spacers. The length of the portion of the dielectric separation region of one of the partial GAA FETs is different than the length of the portion of the dielectric separation region of another one of the partial GAA FETs.

The length of the portion of the dielectric separation of one of the partial GAA FETs may vary from approximately 0 nm to approximately 10 nm, or from approximately 0 nm to approximately 6 nm.

One of the partial GAA FETs may have a high voltage threshold or a regular voltage threshold, and a capacitance of the partial GAA FET may be lower than a capacitance of the other partial GAA FET.

One of the partial GAA FETs may have a low voltage threshold or a super low voltage threshold, and a resistance of the partial GAA FET may be lower than a resistance of the other partial GAA FET.

A length of doped extension regions of the one of the partial GAA FETs may be substantially the same as a length of doped extension regions of another partial GAA FET.

A length of doped extension regions of one partial GAA FET may be less than a length of doped extension regions of another partial GAA FET.

The pair of sidewall spacers of one partial GAA FET may be thinner than the pair of sidewall spacers of another partial GAA FET.

Aspects of the present disclosure are also directed to various embodiments of a field effect transistor. In one embodiment, the field effect transistor includes a fin including a stack of channel regions having at least a first channel region and a second channel region stacked on the first channel region, a source region and a drain region on opposite sides of the fin, a dielectric separation region including a dielectric material between the first channel region and the second channel region, a gate stack on the fin, and a pair of sidewall spacers on opposite sides of the gate stack. An outer edge of the dielectric separation region is laterally between an inner surface and an outer surface of a respective one of the pair of sidewall spacers.

A portion of the dielectric separation region may have a length from an outer edge of the dielectric separation region to an inner edge of a respective one of the sidewall spacers. The length of the portion of the dielectric separation may be from approximately 0 nm to approximately 10 nm, or from approximately 0 nm to approximately 6 nm.

Aspects of the present disclosure are also directed to various methods of manufacturing a CMOS system on chip including a series of partial GAA FETs. In one embodiment, the method includes forming a first partial GAA FET of the series of partial GAA FETs, and forming a second partial GAA FET of the series of partial GAA FETs. Each of the first and second partial GAA FETs includes a fin having a stack of channel regions including at least a first channel region and a second channel region stacked on the first channel region, a source region and a drain region on opposite sides of the fin, a dielectric separation region including a dielectric material between the first channel region and the second channel region, a gate stack on the fin, and a pair of sidewall spacers on opposite sides of the gate stack. A portion of the dielectric separation region has a length from an outer edge of the dielectric separation region to an inner edge of a respective one of the pair of sidewall spacers. The length of the portion of the dielectric separation region of the first partial GAA FET is different than the length of the portion of the dielectric separation region of the second partial GAA FET.

The length of the portion of the dielectric separation of the second partial GAA FET may be less than the length of the portion of the dielectric separation region of the first partial GAA FET. The length of the portion of the dielectric separation of the second partial GAA FET may be from approximately 0 nm to approximately 10 nm, or from approximately 0 nm to approximately 6 nm.

The first partial GAA FET may have a high voltage threshold or a regular voltage threshold, and a capacitance of the first partial GAA FET may be lower than a capacitance of the second partial GAA FET.

The second partial GAA FET may have a low voltage threshold or a super low voltage threshold, and a resistance of the second partial GAA FET may be lower than a resistance of the first partial GAA FET.

A length of doped extension regions of the first partial GAA FET may be substantially the same as a length of doped extension regions of the second partial GAA FET.

A length of doped extension regions of the first partial GAA FET may be different than a length of doped extension region of the second partial GAA FET.

The pair of sidewall spacers of the second partial GAA FET may be thinner than the pair of sidewall spacers of the first partial GAA FET.

Forming the first or second partial GAA FET may include depositing a stack of alternating sacrificial layers and conducting channel layers on a silicon substrate, patterning and etching the stack to form at least one fin, forming a dummy gate stack on the at least one fin, forming external sidewall spacers on opposite sides of the dummy gate stack, laterally etching opposite ends of each of the sacrificial layers, and forming source and drain regions.

This summary is provided to introduce a selection of features and concepts of embodiments of the present disclosure that are further described below in the detailed description. This summary is not intended to identify key or essential features of the claimed subject matter, nor is it intended to be used in limiting the scope of the claimed subject matter. One or more of the described features may be combined with one or more other described features to provide a workable device.

BRIEF DESCRIPTION OF THE DRAWINGS

The features and advantages of embodiments of the present disclosure will become more apparent by reference to the following detailed description when considered in conjunction with the following drawings. In the drawings, like reference numerals are used throughout the figures to reference like features and components. The figures are not necessarily drawn to scale.

DETAILED DESCRIPTION

Figure 1:
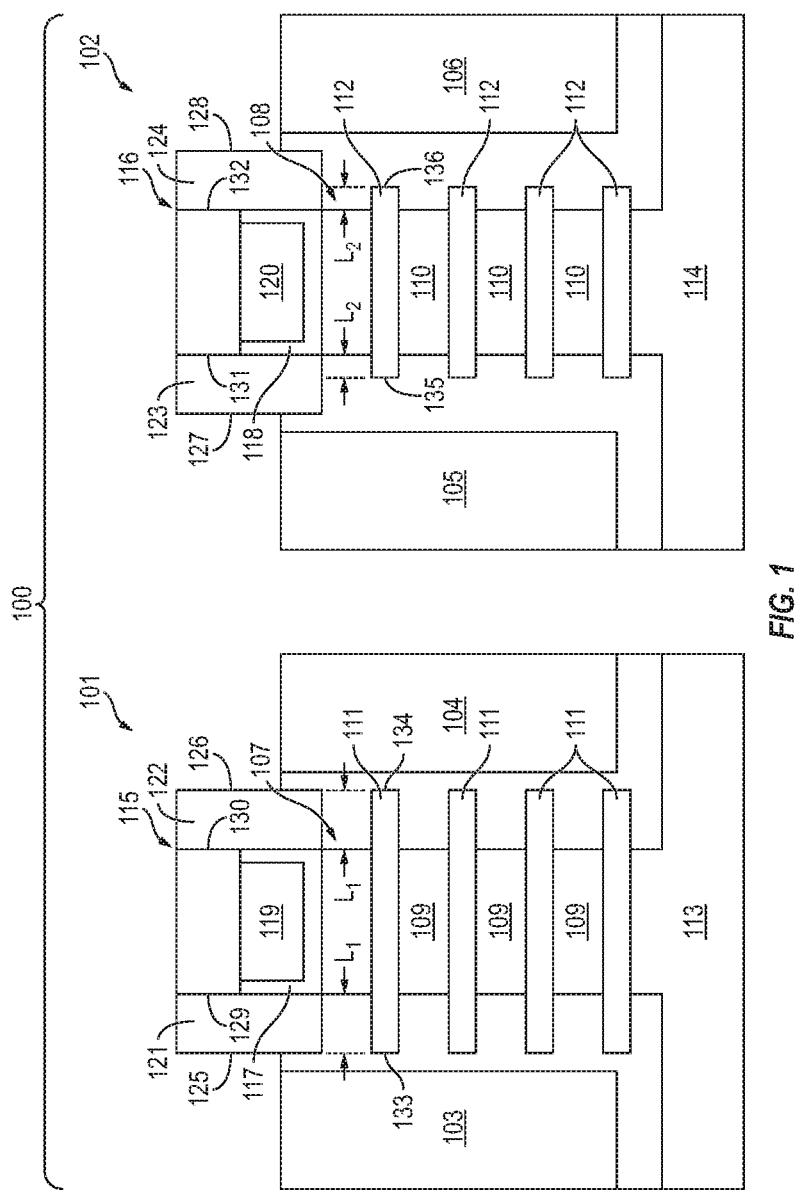
FIG. 1 is a cross-sectional view of a CMOS system on chip (SoC) according to one embodiment of the present disclosure.

The present disclosure is directed to various embodiments of a low-power, high performance CMOS system on chip (SoC) including a series of partial gate-all-around (partial GAA) nFETs and partial GAA pFETs. According to one or more embodiments of the CMOS SoC, dielectric separation regions of the partial GAA nFETs and the partial GAA pFETs do not have the same length for all of the partial GAA nFETs and the partial GAA pFETs (e.g., the length of the dielectric separation region of one of the partial GAA pFETs or partial GAA nFETs is different than the length of the dielectric separation region of at least one other partial GAA pFET or partial GAA nFET of the CMOS SoC). Variance between the lengths of the dielectric separation regions of the partial GAA nFETs and the partial GAA pFETs is configured to achieve the highest performance at lowest dynamic power for the CMOS SoC compared to related art CMOS SoC in which the lengths of the dielectric separation regions are the same for each of the partial GAA pFETs and partial GAA nFETs (e.g., the variance between the lengths of the dielectric separation regions of the partial GAA nFETs and the partial GAA pFETs may achieve the highest performance at lowest dynamic power for the CMOS SoC, compatible with cost).

Hereinafter, example embodiments will be described in more detail with reference to the accompanying drawings, in which like reference numbers refer to like elements throughout. The present invention, however, may be embodied in various different forms, and should not be construed as being limited to only the illustrated embodiments herein. Rather, these embodiments are provided as examples so that this disclosure will be thorough and complete, and will fully convey the aspects and features of the present invention to those skilled in the art. Accordingly, processes, elements, and techniques that are not necessary to those having ordinary skill in the art for a complete understanding of the aspects and features of the present invention may not be described. Unless otherwise noted, like reference numerals denote like elements throughout the attached drawings and the written description, and thus, descriptions thereof may not be repeated.

In the drawings, the relative sizes of elements, layers, and regions may be exaggerated and/or simplified for clarity. Spatially relative terms, such as "beneath," "below," "lower," "under," "above," "upper," and the like, may be used herein for ease of explanation to describe one element or feature's relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly.

It will be understood that, although the terms "first," "second," "third," etc., may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present invention.

It will be understood that when an element or layer is referred to as being "on," "connected to," or "coupled to" another element or layer, it can be directly on, connected to, or coupled to the other element or layer, or one or more intervening elements or layers may be present. In addition, it will also be understood that when an element or layer is referred to as being "between" two elements or layers, it can be the only element or layer between the two elements or layers, or one or more intervening elements or layers may also be present.

The terminology used herein is for the purpose of describing particular embodiments and is not intended to be limiting of the present invention. As used herein, the singular forms "a" and "an" are intended to include the plural forms as well, unless the context clearly indicates otherwise. It will be further understood that the terms "comprises," "comprising," "includes," and "including," when used in this specification, specify the presence of the stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Expressions such as "at least one of," when preceding a list of elements, modify the entire list of elements and do not modify the individual elements of the list.

As used herein, the term "substantially," "about," and similar terms are used as terms of approximation and not as terms of degree, and are intended to account for the inherent variations in measured or calculated values that would be recognized by those of ordinary skill in the art. Further, the use of "may" when describing embodiments of the present invention refers to "one or more embodiments of the present invention." As used herein, the terms "use," "using," and "used" may be considered synonymous with the terms "utilize," "utilizing," and "utilized," respectively. Also, the term "exemplary" is intended to refer to an example or illustration.

Unless otherwise defined, all terms (including technical and scientific terms) used herein have the same meaning as commonly understood by one of ordinary skill in the art to which the present invention belongs. It will be further understood that terms, such as those defined in commonly used dictionaries, should be interpreted as having a meaning that is consistent with their meaning in the context of the relevant art and/or the present specification, and should not be interpreted in an idealized or overly formal sense, unless expressly so defined herein.

With reference now to FIG. 1, a CMOS system on chip (SoC) 100 according to one embodiment of the present disclosure includes a first partial gate-all-around (GAA) field-effect transistor (FET) 101 and a second partial GAA FET 102. In the illustrated embodiment, each of the first and second partial GAA FETs 101, 102 includes source and drain regions 103, 104 and 105, 106, respectively, and at least one fin 107, 108 extending between the source and drain regions 103, 104 and 105, 106, respectively. In the illustrated embodiment, the fin 107, 108 of each of the first and second partial GAA FETs 101, 102 includes a series of stacked channel regions 109, 110, respectively. Additionally, in the illustrated embodiment, each of the partial GAA FETs 101, 102 includes a series of dielectric separation regions 111, 112, respectively, between adjacent channel regions 109, 110 and between a lowermost channel region 109, 110 and a substrate 113, 114 on which the fin 107, 108 is formed. In the illustrated embodiment, each of the partial GAA FETs 101, 102 also includes a gate stack 115, 116 on the fin 107, 108, respectively. Each of the gate stacks 115, 116 includes a gate dielectric layer 117, 118 and a metal layer 119, 120 on the gate dielectric layer 117, 118, respectively. In the illustrated embodiment, each of the partial GAA FETs 101, 102 also includes a pair of sidewall spacers 121, 122 and 123, 124 on opposite sides of the gate stack 115, 116, respectively. Each of the sidewall spacers 121, 122, 123, 124 includes an outer surface 125, 126, 127, 128 facing outward away from the respective gate stack 115, 116 and an inner surface 129, 130, 131, 132 opposite the respective outer surface 125, 126, 127, 128 facing inward toward the respective gate stack 115, 116.

With continued reference to the embodiment illustrated in FIG. 1, portions of each of the dielectric separation regions 111 of the first partial GAA FET 101 have a length $L_1$ defined from an outer edge 133, 134 of the dielectric separation region 111 to the inner surface 129, 130 of the respective sidewall spacer 121, 122 (e.g., the inner surface 129, 130 of the overlying sidewall spacer 121, 122). Additionally, in the illustrated embodiment, portions of each of the dielectric separation regions 112 of the second partial GAA FET 102 have a length $L_2$ defined from an outer edge 135, 136 of the dielectric separation region 112 to the inner surface 131, 132 of the respective sidewall spacer 123, 124 (e.g., the inner surface 131, 132 of the overlying sidewall spacer 123, 124). Additionally, in the illustrated embodiment, the length $L_1$ of the portions of the dielectric separation regions 111 of the first partial GAA FET 101 is greater than the length $L_2$ of the portions of the dielectric separation regions 112 of the second partial GAA FET 102. In the illustrated embodiment, the outer edges 133, 134 of the dielectric separation regions 111 of the first partial GAA FET 101 are aligned or substantially aligned with the outer surface 125, 126 of the overlying sidewall spacer 121, 122, respectively, and the outer edges 135, 136 of the dielectric separation regions 112 of the second partial GAA FET 102 are between the inner surface 131, 132 and the outer surfaces 127, 128 of the overlying sidewall spacer 123, 124, respectively. Accordingly, in the illustrated embodiment, the dielectric separation regions 111 of the first partial GAA FET 101 are longer than the dielectric separation regions 112 of the second partial GAA FET 102.

In one or more embodiments, the first and second partial GAA FETs 101, 102, which have dielectric separation regions with different lengths $L_1$, $L_2$, have different threshold voltages $V_t$ or the same threshold voltages $V_t$. In one or more embodiments, the CMOS SoC 100 may include a series of partial GAA FETs with different threshold voltages, and the first and second partial GAA FETs 101, 102 with the different threshold voltages $V_t$ are at least a subset of the partial GAA FETs of the CMOS SoC 100 with different threshold voltages. In one or more embodiments, the first and second partial GAA FETs 101, 102, which have dielectric separation regions 111, 112 with different lengths $L_1$, $L_2$, may be provided at different portions of the CMOS SoC 100. In one or more embodiments, the first partial GAA FET 101, which has dielectric separation regions 111 with a longer length than in the second partial GAA FET 102, has or may have a high voltage threshold $V_t$ (HVT) or a regular voltage threshold (RVT), whereas the second partial GAA FET 102, which has dielectric separation regions 112 with a shorter length than in the first partial GAA FET 101, has or may have a low voltage threshold (LVT) or a super low voltage threshold $V_t$ (SLVT). In one or more embodiments, the length of dielectric separation regions of an HVT partial GAA FET are longer than the length of the dielectric separation regions of a RVT partial GAA FET. Additionally, the length of the dielectric separation regions of the RVT partial GAA FET are longer than the length of the dielectric separation regions of an LVT partial GAA FET, and the length of the dielectric separation regions of the LVT partial GAA FET is longer than the length of the dielectric separation regions of an SLVT partial GAA FET. In one or more embodiments, the threshold voltage $V_t$ difference between the HVT partial GAA FET and the RVT partial GAA FET, between the RVT partial GAA FET and the LVT partial GAA FET, and between the LVT partial GAA FET and the SLVT partial GAA FET is from approximately 20 mV to approximately 50 mV. In one or more embodiments, the first partial GAA FET 101, which has the relatively longer dielectric separation regions 111, may be provided in a portion of the CMOS SoC 100 for which parasitic gate-to-drain capacitance (Cgd) is minimized or at least reduced to reduce the dynamic power associated with that portion of the CMOS SoC 100. Additionally, in one or more embodiments, this portion of the CMOS SoC 100 may include at least a subset of the GPU cores. In one or more embodiments, this portion of the CMOS SoC 100 in which the first partial GAA FET 101 is located may include at least a subset of the GPU cores and/or at least a subset of the GPU and CPU cores that do not include critical speed paths. In one or more embodiments, the second partial GAA FET 102, which has the relatively shorter dielectric separation regions 112, may be provided in a portion of the CMOS SoC 100 that includes, for instance, critical speed paths, and for which parasitic extension resistance ($R_{ext}$) is minimized or at least reduced to increase the effective drive current ($I_{eff}$) associated with this portion of the CMOS SoC 100.

In one or more embodiments in which the second partial GAA FET 102 is an LVT partial GAA FET, the length $L_2$ of the portions of the dielectric separation regions 112 may be from approximately 0 nm (e.g., the outer surfaces 135, 136 of the dielectric separation regions 112 may be aligned or substantially aligned with the inner surface 131, 132 of the respective sidewall spacer 123, 124) to approximately 6 nm. In one or more embodiments, the length $L_2$ of the portions of the dielectric separation regions 112 may be from approximately 0 nm to approximately 3 nm. In one or more embodiments in which the first partial GAA FET 101 is provided in a portion of the CMOS SoC 100 for which Cgd is minimized or at least reduced, the length $L_1$ of the portions of the dielectric separation regions 111 in the first partial GAA FET 101 may be greater than 0 nm (e.g., from approximately 3 nm to approximately 10 nm). In one or more embodiments, the length $L_1$ of the portions of the dielectric separation regions 111 in the first partial GAA FET 101 may be equal or substantially equal to the width of the sidewall spacer 123, 124 such that the outer surfaces 133, 134 of the dielectric separation regions 111 are aligned or substantially aligned with the outer surface 125, 126 of the respective sidewall spacer 121, 122.

Figure 2:
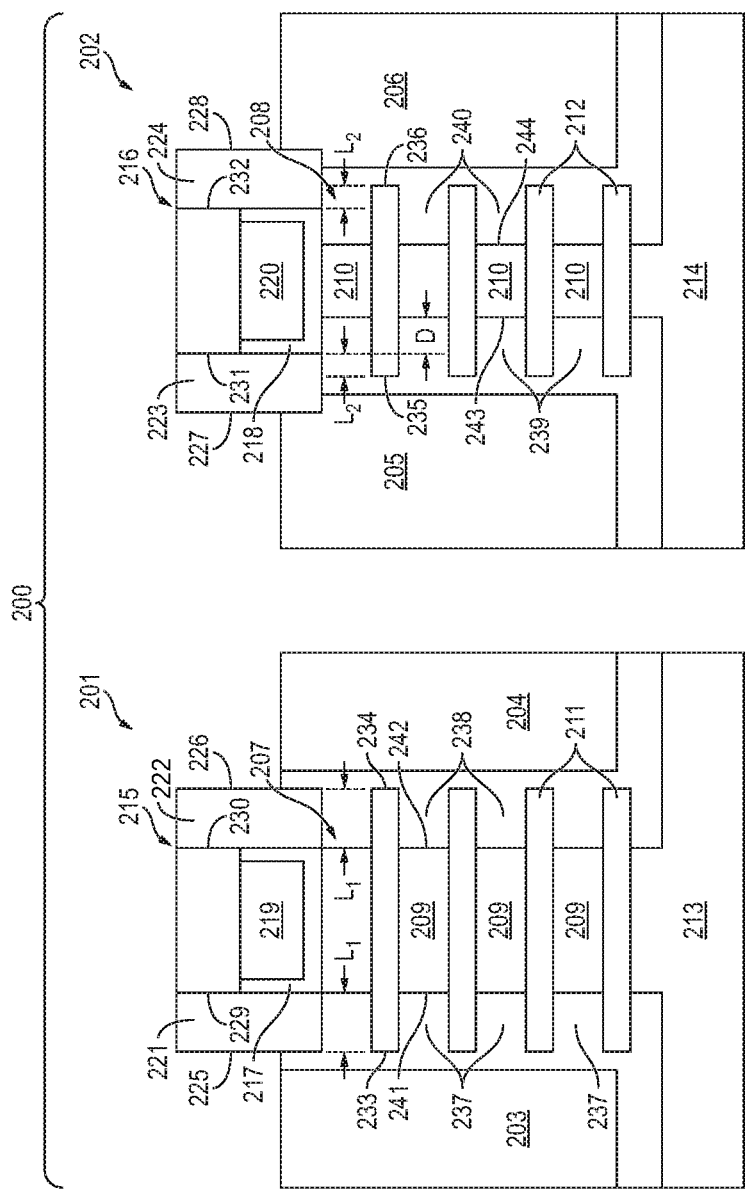
FIG. 2 is a cross-sectional view of a CMOS SoC according to another embodiment of the present disclosure.

With reference now to FIG. 2, a CMOS SoC 200 according to another embodiment of the present disclosure includes a first partial GAA FET 201 and a second partial GAA FET 202. In the illustrated embodiment, each of the first and second partial GAA FETs 201, 202 includes source and drain regions 203, 204 and 205, 206, respectively, and at least one fin 207, 208 extending between the source and drain regions 203, 204 and 205, 206, respectively. In the illustrated embodiment, the fin 207, 208 of each of the first and second partial GAA FETs 201, 202 includes a series of stacked channel regions 209, 210, respectively. Additionally, in the illustrated embodiment, each of the partial GAA FETs 201, 202 includes a series of dielectric separation regions 211, 212, respectively, between adjacent channel regions 209, 210 and between a lowermost channel region 209, 210 and a substrate 213, 214 on which the fin 207, 208 is formed. In the illustrated embodiment, each of the partial GAA FETs 201, 202 also includes a gate stack 215, 216 on the fin 207, 208, respectively. Each of the gate stacks 215, 216 includes a gate dielectric layer 217, 218 and a metal layer 219, 220 on the gate dielectric layer 217, 218, respectively. In the illustrated embodiment, each of the partial GAA FETs 201, 202 also includes a pair of sidewall spacers 221, 222 and 223, 224 on opposite sides of the gate stack 215, 216, respectively. Each of the sidewall spacers 221, 222, 223, 224 includes an outer surface 225, 226, 227, 228 facing outward away from the respective gate stack 215, 216 and an inner surface 229, 230, 231, 232 opposite the respective outer surface 225, 226, 227, 228 facing inward toward the respective gate stack 215, 216.

In the embodiment illustrated in FIG. 2, portions of each of the dielectric separation regions 211 of the first partial GAA FET 201 have a length $L_1$ defined from an outer edge 233, 234 of the dielectric separation region 211 to the inner surface 229, 230 of the respective sidewall spacer 221, 222 (e.g., the inner surface 229, 230 of the overlying sidewall spacer 221, 222). Additionally, in the illustrated embodiment, portions of each of the dielectric separation regions 212 of the second partial GAA FET 202 have a length $L_2$ defined from an outer edge 235, 236 of the dielectric separation region 212 to the inner surface 231, 232 of the respective sidewall spacer 223, 224 (e.g., the inner surface 231, 232 of the overlying sidewall spacer 223, 224). Additionally, in the illustrated embodiment, the length $L_1$ of the portions of the dielectric separation regions 211 of the first partial GAA FET 201 is greater than the length $L_2$ of the portions of the dielectric separation regions 212 of the second partial GAA FET 202. Accordingly, in the illustrated embodiment, the dielectric separation regions 211 of the first partial GAA FET 201 are longer than the dielectric separation regions 212 of the second partial GAA FET 202. The lengths $L_1$, $L_2$ of the portions of the dielectric separation regions 211, 212 may be the same as or similar to the lengths described above with reference to the embodiment illustrated in FIG. 1. As described above with reference to the embodiment illustrated in FIG. 1, the first partial GAA FET 201, which has dielectric separation regions 211 with a longer length than in the second partial GAA FET 202, has or may have a high voltage threshold $V_t$ (HVT) or a regular voltage threshold (RVT), whereas the second partial GAA FET 202, which has dielectric separation regions 212 with a shorter length than in the first partial GAA FET 201, has or may have a low voltage threshold (LVT) or a super low voltage threshold $V_t$ (SLVT).

Additionally, unlike the embodiment of the CMOS SoC 100 illustrated in FIG. 1, in the embodiment of the CMOS SoC 200 illustrated in FIG. 2, the extension under the gate stack 215 of doped extension regions 237, 238 of the source and drain regions 203, 204 in the first partial GAA FET 201 is different than the extension under the gate stack 216 of doped extension regions 239, 240 of the source and drain regions 205, 206 in the second partial GAA FET 202. In the illustrated embodiment, inner edges 241, 242 of the doped extension regions 237, 238 in the first partial GAA FET 201 are aligned or substantially aligned with the inner surfaces of the sidewall spacers, and inner edges 243, 244 of the doped extension regions 239, 240 in the second partial GAA FET 202 are spaced inwardly from the inner surface of the respective sidewall spacer by a distance D (e.g., the doped extension regions 239, 240 of the second partial GAA FET 202 extend further under the gate stack 216 than the doped extension regions 237, 238 extend under the gate stack 215 of the first partial GAA FET 201). In one or more embodiments, the distance D that the inner surfaces 243, 244 of the doped extension regions 239, 240 of the second partial GAA FET 201 are spaced inwardly from the inner surfaces 231, 232 of the sidewall spacers 223, 224, respectively, is in a range from approximately 0 nm to approximately 10 nm (e.g., a range from approximately 0 nm to approximately 5 nm).

In one or more embodiments, the first partial GAA FET 201, which has the relatively longer dielectric separation regions 211, may be provided in a portion of the CMOS SoC 200 for which parasitic gate-to-drain capacitance (Cgd) is minimized or at least reduced to reduce the dynamic power associated with that portion of the CMOS SoC 200. In one or more embodiments, the second partial GAA FET 202, which has the relatively shorter dielectric separation regions 212, may be provided in a portion of the CMOS SoC 200 that includes, for instance, critical speed paths, and for which parasitic extension resistance ($R_{ext}$) is minimized or at least reduced to increase the effective drive current ($I_{eff}$) associated with this portion of the CMOS SoC 200.

Figure 3:
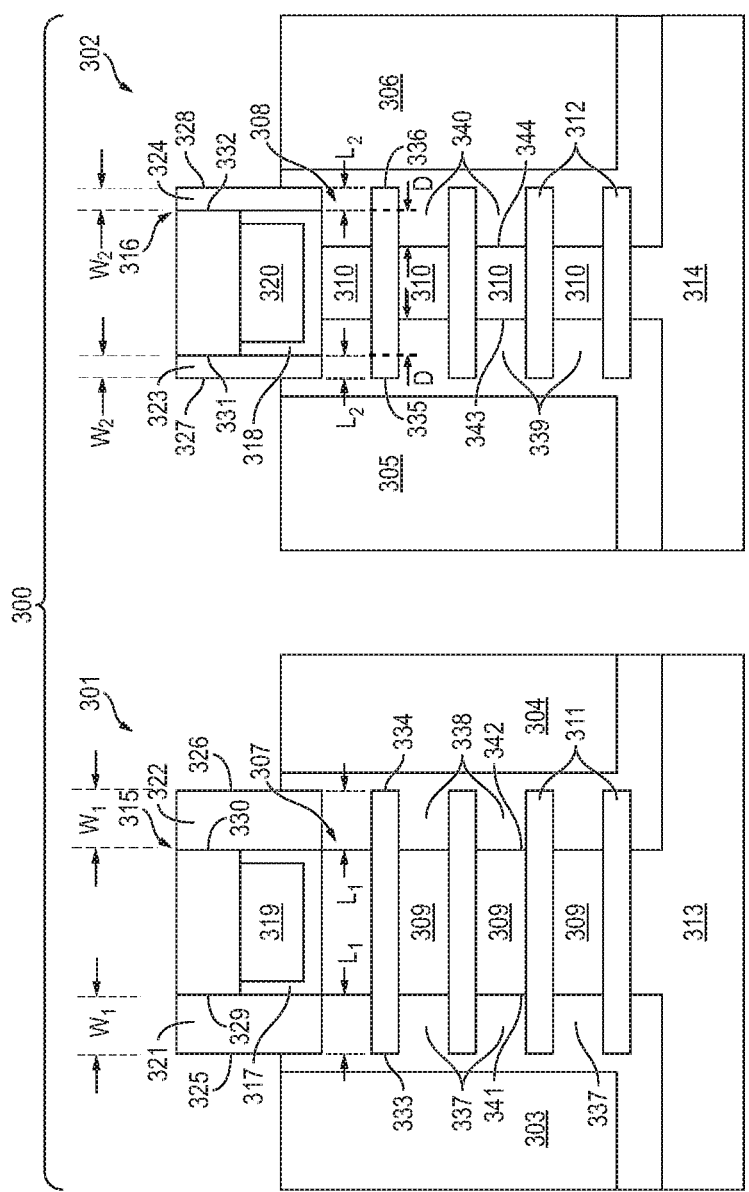
FIG. 3 is a cross-sectional view of a CMOS SoC according to a further embodiment of the present disclosure.

With reference now to FIG. 3, a CMOS SoC 300 according to another embodiment of the present disclosure includes a first partial GAA FET 301 and a second partial GAA FET 302. In the illustrated embodiment, each of the first and second partial GAA FETs 301, 302 includes source and drain regions 303, 304 and 305, 306, respectively, and at least one fin 307, 308 extending between the source and drain regions 303, 304 and 305, 306, respectively. In the illustrated embodiment, the fin 307, 308 of each of the first and second partial GAA FETs 301, 302 includes a series of stacked channel regions 309, 310, respectively. Additionally, in the illustrated embodiment, each of the partial GAA FETs 301, 302 includes a series of dielectric separation regions 311, 312, respectively, between adjacent channel regions 309, 310 and between a lowermost channel region 309, 310 and a substrate 313, 314 on which the fin 307, 308 is formed. In the illustrated embodiment, each of the partial GAA FETs 301, 302 also includes a gate stack 315, 316 on the fin 307, 308, respectively. Each of the gate stacks 315, 316 includes a gate dielectric layer 317, 318 and a metal layer 319, 320 on the gate dielectric layer 317, 318, respectively. In the illustrated embodiment, each of the partial GAA FETs 301, 302 also includes a pair of sidewall spacers 321, 322 and 323, 324 on opposite sides of the gate stack 315, 316, respectively. Each of the sidewall spacers 321, 322, 323, 324 includes an outer surface 325, 326, 327, 328 facing outward away from the respective gate stack 315, 316 and an inner surface 329, 330, 331, 332 opposite the respective outer surface 325, 326, 327, 328 facing inward toward the respective gate stack 315, 316.

Additionally, in the illustrated embodiment, the sidewall spacers 321, 322 of the first partial GAA FET 301 have a width $W_1$ defined from the inner surface 329, 330 to the respective outer surface 325, 326, and the sidewall spacers 323, 324 of the second partial GAA FET 302 have a width $W_2$ defined from the inner surface 331, 332 to the respective outer surface 327, 328. In the illustrated embodiment, the width $W_2$ of the sidewall spacers 323, 324 of the second partial GAA FET 302 is less than the width $W_1$ of the sidewall spacers 321, 322 of the first partial GAA FET 301 (e.g., the sidewall spacers 323, 324 of the second partial GAA FET 302 are relatively narrower than the sidewall spacers 321, 322 of the first partial GAA FET 301).

In the embodiment illustrated in FIG. 3, portions of each of the dielectric separation regions 311 of the first partial GAA FET 301 have a length $L_1$ defined from an outer edge 333, 334 of the dielectric separation region 311 to the inner surface 329, 330 of the respective sidewall spacer 321, 322 (e.g., the inner surface 329, 330 of the overlying sidewall spacer 321, 322). Additionally, in the illustrated embodiment, portions of each of the dielectric separation regions 312 of the second partial GAA FET 302 have a length $L_2$ defined from an outer edge 335, 336 of the dielectric separation region 312 to the inner surface 331, 332 of the respective sidewall spacer 323, 324 (e.g., the inner surface 331, 332 of the overlying sidewall spacer 323, 324). Additionally, in the illustrated embodiment, the length $L_1$ of the portions of the dielectric separation regions 311 of the first partial GAA FET 301 is greater than the length $L_2$ of the portions of the dielectric separation regions 312 of the second partial GAA FET 302. Accordingly, in the illustrated embodiment, the dielectric separation regions 311 of the first partial GAA FET 301 are longer than the dielectric separation regions 312 of the second partial GAA FET 302. The lengths $L_1$, $L_2$ of the portions of the dielectric separation regions 311, 312 may be the same as or similar to the lengths described above with reference to the embodiment illustrated in FIG. 1. As described above with reference to the embodiment illustrated in FIG. 1, the first partial GAA FET 301, which has dielectric separation regions 311 with a longer length than in the second partial GAA FET 302, has or may have a high voltage threshold $V_t$ (HVT) or a regular voltage threshold (RVT), whereas the second partial GAA FET 302, which has dielectric separation regions 312 with a shorter length than in the first partial GAA FET 301, has or may have a low voltage threshold (LVT) or a super low voltage threshold $V_t$ (SLVT).

With continued reference to the embodiment illustrated in FIG. 3, the extension under the gate stack 315 of doped extension regions 337, 338 of the source and drain regions 303, 304 in the first partial GAA FET 301 is different than the extension under the gate stack 316 of doped extension regions 339, 340 of the source and drain regions 305, 306 in the second partial GAA FET 302. In the illustrated embodiment, inner edges 341, 342 of the doped extension regions 337, 338 in the first partial GAA FET 301 are aligned or substantially aligned with the inner surfaces 329, 330 of the sidewall spacers 321, 322, and inner edges 343, 344 of the doped extension regions 339, 340 in the second partial GAA FET 302 are spaced inwardly from the inner surface 331, 332 of the respective sidewall spacer 323, 324 by a distance D (e.g., the doped extension regions 339, 340 of the second partial GAA FET 302 extend further under the gate stack than the doped extension regions 337, 338 of the first partial GAA FET 301). In one or more embodiments, the distance D that the inner surfaces 343, 344 of the doped extension regions 339, 340 of the second partial GAA FET 302 are spaced inwardly from the inner surfaces 331, 332 of the sidewall spacers 323, 324, respectively, is in a range from approximately 0 nm to approximately 10 nm (e.g., a range from approximately 0 nm to approximately 5 nm).

In one or more embodiments, the first partial GAA FET 301, which has the relatively longer dielectric separation regions 311, and the relatively wider sidewall spacers 321, 322 may be provided in a portion of the CMOS SoC 300 for which parasitic gate-to-drain capacitance (Cgd) is minimized or at least reduced to reduce the dynamic power associated with that portion of the CMOS SoC 300. In one or more embodiments, the second partial GAA FET 302, which has the relatively shorter dielectric separation regions 312, and the relatively narrower sidewall spacers 323, 324 may be provided in a portion of the CMOS SoC 300 that includes, for instance, critical speed paths, and for which parasitic extension resistance ($R_{ext}$) is minimized or at least reduced to increase the effective drive current ($I_{eff}$) associated with this portion of the CMOS SoC 300.

Figure 4:
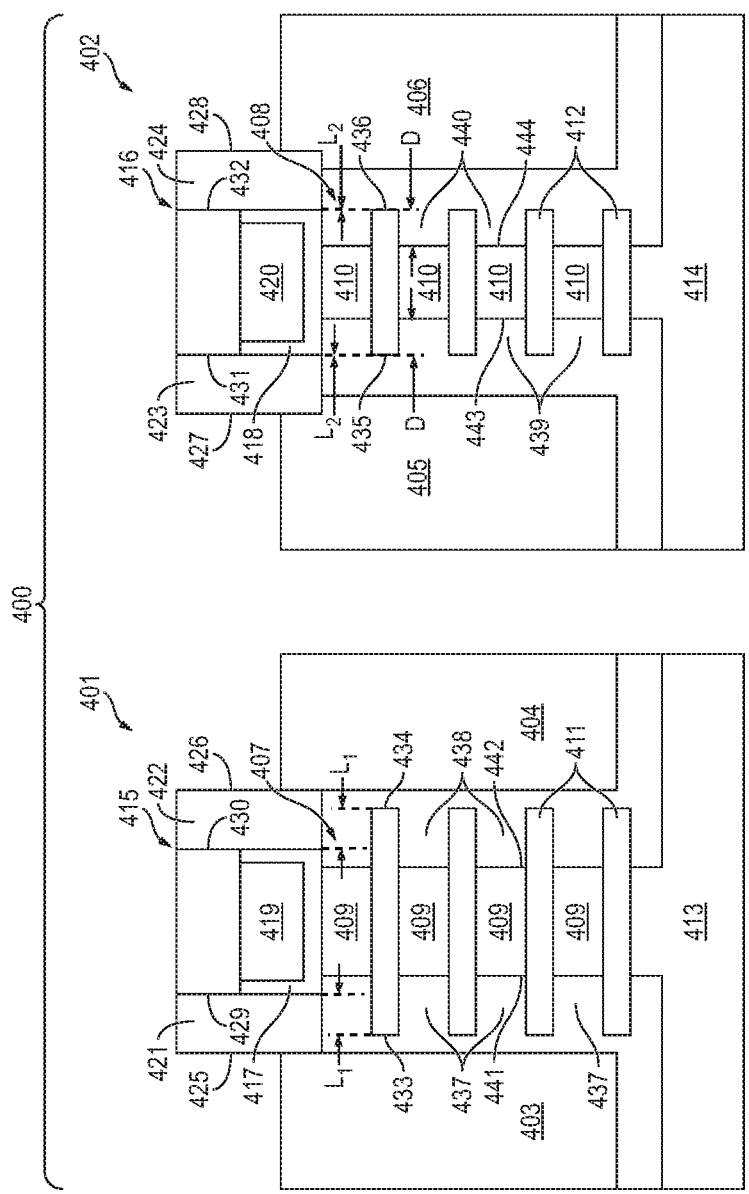
FIG. 4 is a cross-sectional view of a CMOS SoC according to another embodiment of the present disclosure.

With reference now to FIG. 4, a CMOS SoC 400 according to another embodiment of the present disclosure includes a first partial GAA FET 401 and a second partial GAA FET 402. In the illustrated embodiment, each of the first and second partial GAA FETs 401, 402 includes source and drain regions 403, 404 and 405, 406, respectively, and at least one fin 407, 408 extending between the source and drain regions 403, 404 and 405, 406, respectively. In the illustrated embodiment, the fin 407, 408 of each of the first and second partial GAA FETs 401, 402 includes a series of stacked channel regions 409, 410, respectively. Additionally, in the illustrated embodiment, each of the partial GAA FETs 401, 402 includes a series of dielectric separation regions 411, 412, respectively, between adjacent channel regions 409, 410 and between a lowermost channel region 409, 410 and a substrate 413, 414 on which the fin 407, 408 is formed. In the illustrated embodiment, each of the partial GAA FETs 401, 402 also includes a gate stack 415, 416 on the fin 407, 408, respectively. Each of the gate stacks 415, 416 includes a gate dielectric layer 417, 418 and a metal layer 419, 420 on the gate dielectric layer 417, 418, respectively. In the illustrated embodiment, each of the partial GAA FETs 401, 402 also includes a pair of sidewall spacers 421, 422 and 423, 424 on opposite sides of the gate stack 415, 416, respectively. Each of the sidewall spacers 421, 422, 423, 424 includes an outer surface 425, 426, 427, 428 facing outward away from the respective gate stack 415, 416 and an inner surface 429, 430, 431, 432 opposite the respective outer surface 425, 426, 427, 428 facing inward toward the respective gate stack 415, 416.

In the embodiment illustrated in FIG. 4, portions of each of the dielectric separation regions 411 of the first partial GAA FET 401 have a length $L_1$ defined from an outer edge 433, 434 of the dielectric separation region 411 to the inner surface 429, 430 of the respective sidewall spacer 421, 422 (e.g., the inner surface 429, 430 of the overlying sidewall spacer 421, 422). Additionally, in the illustrated embodiment, portions of each of the dielectric separation regions 412 of the second partial GAA FET 402 have a length $L_2$ defined from an outer edge 435, 436 of the dielectric separation region 412 to the inner surface 431, 432 of the respective sidewall spacer 423, 424 (e.g., the inner surface 431, 432 of the overlying sidewall spacer 423, 424). Additionally, in the illustrated embodiment, the length $L_1$ of the portions of the dielectric separation regions 411 of the first partial GAA FET 401 is greater than the length $L_2$ of the portions of the dielectric separation regions 412 of the second partial GAA FET 402. Accordingly, in the illustrated embodiment, the dielectric separation regions 411 of the first partial GAA FET 401 are longer than the dielectric separation regions 412 of the second partial GAA FET 402. The lengths $L_1$, $L_2$ of the portions of the dielectric separation regions 411, 412 may be the same as or similar to the lengths described above with reference to the embodiment illustrated in FIG. 1. In one or more embodiments, the length $L_2$ of the dielectric separation regions of the second partial GAA FET may be zero or substantially zero such that the outer edges of the dielectric separation regions of the second partial GAA FET are aligned or substantially aligned with the inner surfaces of the sidewall spacers, respectively. As described above with reference to the embodiment illustrated in FIG. 1, the first partial GAA FET 401, which has dielectric separation regions 411 with a longer length than in the second partial GAA FET 402, has or may have a high voltage threshold $V_t$ (HVT) or a regular voltage threshold (RVT), whereas the second partial GAA FET 402, which has dielectric separation regions 412 with a shorter length than in the first partial GAA FET 401, has or may have a low voltage threshold (LVT) or a super low voltage threshold $V_t$ (SLVT).

Additionally, in the embodiment of the CMOS SoC 400 illustrated in FIG. 4, the extension under the gate stack 415 of doped extension regions 437, 438 of the source and drain regions 403, 404 in the first partial GAA FET 401 is different than the extension under the gate stack 416 of doped extension regions 339, 440 of the source and drain regions 405, 406 in the second partial GAA FET 402. In the illustrated embodiment, inner edges 441, 442 of the doped extension regions 437, 438 in the first partial GAA FET 401 are aligned or substantially aligned with the inner surfaces 429, 430 of the sidewall spacers 421, 422, and inner edges 443, 444 of the doped extension regions 439, 440 in the second partial GAA FET 402 are spaced inwardly from the inner surface 431, 432 of the respective sidewall spacer 423, 424 by a distance D (e.g., the doped extension regions 439, 440 of the second partial GAA FET 402 extend further under the gate stack than the doped extension regions 437, 438 of the first partial GAA FET 401). In one or more embodiments, the distance D that the inner surfaces 443, 444 of the doped extension regions 439, 440 of the second partial GAA FET 402 are spaced inwardly from the inner surfaces 431, 432 of the sidewall spacers 423, 424, respectively, is in a range from approximately 0 nm to approximately 10 nm (e.g., a range from approximately 0 nm to approximately 5 nm).

In one or more embodiments, the first partial GAA FET 401, which has the relatively longer dielectric separation regions 411, may be provided in a portion of the CMOS SoC 400 for which parasitic gate-to-drain capacitance (Cgd) is minimized or at least reduced to reduce the dynamic power associated with that portion of the CMOS SoC 400. In one or more embodiments, the second partial GAA FET 402, which has the relatively shorter dielectric separation regions 412, may be provided in a portion of the CMOS SoC 400 that includes, for instance, critical speed paths, and for which parasitic extension resistance ($R_{ext}$) is minimized or at least reduced to increase the effective drive current ($I_{eff}$) associated with this portion of the CMOS SoC 400.

A CMOS SoC according to one or more embodiments of the present disclosure may have any suitable combination of features of two or more of the embodiments of the CMOS SoC 100, 200, 300, 400 described above with references to FIGS. 1-4.

FIGS. 5A-5D depict tasks of a method of manufacturing a CMOS system on chip (SoC) 500 including first and second partial gate-all-around (GAA) FETs 501, 502 (see FIG. 5D) according to one embodiment of the present disclosure. The first and second partial GAA FETs 501, 502 may be partial GAA nFETs, partial GAA pFETs, or a combination of a partial GAA nFET and a partial GAA pFET. The first partial GAA FET 501 may be formed in a portion of the CMOS SoC 500 for which parasitic gate-to-drain capacitance (Cgd) is minimized or at least reduced to reduce the dynamic power associated with that portion of the CMOS SoC 500. The second partial GAA FET 502 may be formed in a portion of the CMOS SoC 500 that includes, for instance, critical speed paths, and for which parasitic extension resistance ($R_{ext}$) is minimized or at least reduced to increase the effective drive current ($I_{eff}$) associated with this portion of the CMOS SoC 500. In one or more embodiments, the first partial GAA FET 501 has or may have a high voltage threshold $V_t$ (HVT) or a regular voltage threshold (RVT), and the second partial GAA FET 502 has or may have a low voltage threshold (LVT) or a super low voltage threshold $V_t$ (SLVT).

Figure 5A:
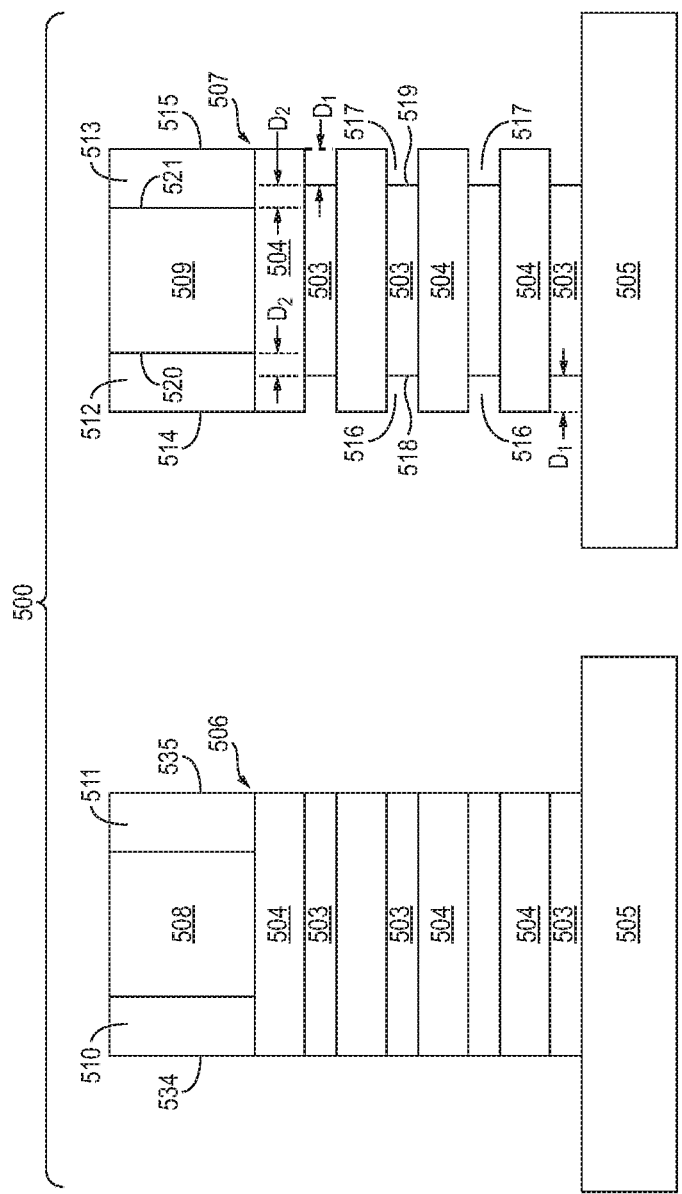
FIGS. 5A-5D illustrate tasks of a method of manufacturing a CMOS SoC according to one embodiment of the present disclosure.

As illustrated in FIG. 5A, the method includes a task of layer-by-layer deposition of a stack of alternating sacrificial layers 503 and conducting channel layers 504 on a silicon substrate 505 such that the lowermost sacrificial layer 503 is directly on the silicon substrate 505 and each of the remaining sacrificial layers 503 is disposed between an underlying channel layer 504 and an overlying channel layer 504. In one or more embodiments, the sacrificial layers 503 are formed of SiGe and the conducting channel layers 504 are formed of Si. In one or more embodiments, the SiGe material of the sacrificial layers 503 may include Ge in the range from approximately 15% to approximately 35%. In one or more embodiments, the sacrificial layers 503 have a thickness from approximately 2 nm to approximately 6 nm and the conducting channel layers 504 have a thickness from approximately 2 nm to approximately 12 nm. The silicon substrate 505 may include a (100) or (110) silicon substrate. Although in the illustrated embodiment the task includes depositing four conducting channel layers 504 and four sacrificial layers 503, in one or more embodiments, the task may include depositing any other suitable number of conducting channel layers 504 and sacrificial layers 503 depending on the desired size of the first and second FETs 501, 502 (e.g., the task may include depositing one or more conducting channel layers 504 and one or more sacrificial layers 503).

In one or more embodiments, the conducting channel layers 504 and the sacrificial layers 503 may not be formed of Si and SiGe, respectively. In one or more embodiments, the conducting channel layers 504 and the sacrificial layers 503 may be any other suitable materials whereby the sacrificial layers 503 can be selectively etched relative to conducting channel layers 504 for n-type FETs, p-type FETs, or both n-type and p-type FETs. In one or more embodiments in which the FET is an n-type FET, the materials of the conducting channel layers 504 and the sacrificial layers 503 may be Group III-V materials, such as InGaAs and InP, respectively. In one or more embodiments, the materials of the conducting channel layers 504 and the sacrificial layers 503 may be Group IV materials, such as Ge and SiGe, respectively, for either n-type FETs or p-type FETs. In one or more embodiments in which the FET is a p-type FET, the materials of the conducting channel layers 504 and the sacrificial layers 503 may be Group IV materials, such as SiGe and Si, respectively.

With continued reference to the embodiment illustrated in FIG. 5A, the method also includes a task of patterning and etching the stack of conducting channel layers 504 and sacrificial layers 503 to form at least one fin 506, 507 having a desired width for the first and second partial GAA FETs 501, 502, respectively. The task of patterning and etching the stack of alternating conducting channel layers 504 and the sacrificial layers 503 may be performed by any suitable process or technique, such as, for instance, lithography, or etching (e.g., dry etching). In one or more embodiments, the task of forming the fins 506, 507 may include a single mask step and etch step or multiple mask steps and etch steps. In one or more embodiments, the task may include an etch (e.g., a dry etch) that is not selective to either the material of the channel layers 504 or the material of the sacrificial layers 503. Although in the illustrated embodiment each partial GAA FET includes only a single fin 506, 507, in one or more embodiments the method may include forming two or more fins for one or more of the partial GAA FETs. In one or more embodiments in which the method includes forming two or more fins for one or more of the partial GAA FETs, the task of patterning and etching the stack of conducting channel layers 504 and sacrificial layers 503 includes forming the fins with the desired horizontal separation distance between adjacent fins.

With continued reference to the embodiment illustrated in FIG. 5A, the method also includes a task of forming a dummy gate stack 508, 509 (e.g., a dummy gate stack 508, 509 formed of oxide/poly-Si/nitride) on the fins 506, 507, respectively, and forming external sidewall spacers 510, 511 and 512, 513 on opposite sides of the dummy gate stacks 508, 509, respectively, by any process known in the art, such as nitride deposition.

In the embodiment illustrated in FIG. 5A, the method also includes a task of masking the regions of the first partial GAA FET and etching regions of the one or more fins 507 of the second partial GAA FET not protected by the dummy gate 509 and the external sidewall spacers 512, 513. In one or more embodiments, the etching of the one or more fins 507 of the second partial GAA FET proceeds all the way down to, or into, the silicon substrate 505. In one or more embodiments, the etch of the one or more fins 507 of the second partial GAA FET is a vertical or substantially vertical recess etch and the recess etch is aligned or substantially aligned with outer edges, 514, 515 of the external sidewall spacers 512, 513, respectively.

With continued reference to the embodiment illustrated in FIG. 5A, the method also includes a task of laterally etching opposite ends of each of the sacrificial layers 503 (e.g., the sacrificial layers 503 formed of SiGe) of the fin 507 of the second partial GAA FET. The lateral recess etch may be wet etch or a dry etch known in the art. During the task of laterally etching the sacrificial layers 503, opposite ends of the sacrificial layers 503 are removed laterally, but the channel layers 504 remain substantially intact. Accordingly, the channel layers 504 extend beyond (e.g., overhang) the sacrificial layers 503 following the task of laterally etching opposite ends of the sacrificial layers 503 and recesses 516, 517 are formed between outer edges 518, 519, respectively, of the recessed sacrificial layers 503 and the overhanging portions of the channel layers 504. The recesses 516, 517 may have any shape (e.g., a rectangular cross-sectional shape or a trapezoidal cross-sectional shape) depending on the selectivity of the lateral etch of the material of the sacrificial layers 503 to the material of the channel layers 504.

The sacrificial layers 503 of the fin 507 of the second partial GAA FET may be laterally recessed to any suitable depth $D_1$ depending on the desired length of dielectric separation regions of the second partial GAA FET 502, formed during a subsequent task of the method described below. In one or more embodiments, the lateral recess etch of the sacrificial layers 503 may be performed to a depth $D_1$ such that the outer edges 518, 519 of the laterally etched sacrificial layers 503 are laterally spaced apart from an inner surface 520, 521 of the respective sidewall spacer 512, 513 by a distance $D_2$ (e.g., each of the outer edges 518, 519 of the laterally etched sacrificial layers 503 are laterally spaced apart from the inner surface 520, 521 of the overlying sidewall spacer 512, 513 by a distance $D_2$). In one or more embodiments, the distance $D_2$ may be from approximately 0 nm (e.g., the outer edges 518, 519 of the laterally etched sacrificial layers 503 are aligned or substantially aligned with the inner surface 520, 521 of the respective sidewall spacer 512, 513) to approximately 10 nm. In one or more embodiments, the distance $D_2$ may be from approximately 0 nm to approximately 6 nm. In one or more embodiments, the distance $D_2$ may be from approximately 0 nm to approximately 3 nm. In one or more embodiments in which the distance $D_2$ is greater than 0 nm, the distance $D_2$ is measured from the inner surface 520, 521 of the respective sidewall spacer 512, 513 in a direction toward the outer surface 514, 515 of the respective sidewall spacer 512, 513 (e.g., in one or more embodiments, the outer edges 518, 519 of the laterally etched sacrificial layers 503 are laterally between the inner and outer surfaces 520, 514 and 521, 515 of the respective sidewall spacer 512, 513). In the illustrated embodiment, the sacrificial layers 503 of the fin 506 for the first partial GAA FET are not laterally etched or are laterally etched to a lesser extent than the sacrificial layers 503 of the fin 507 for the second partial GAA FET.

Figure 5B:
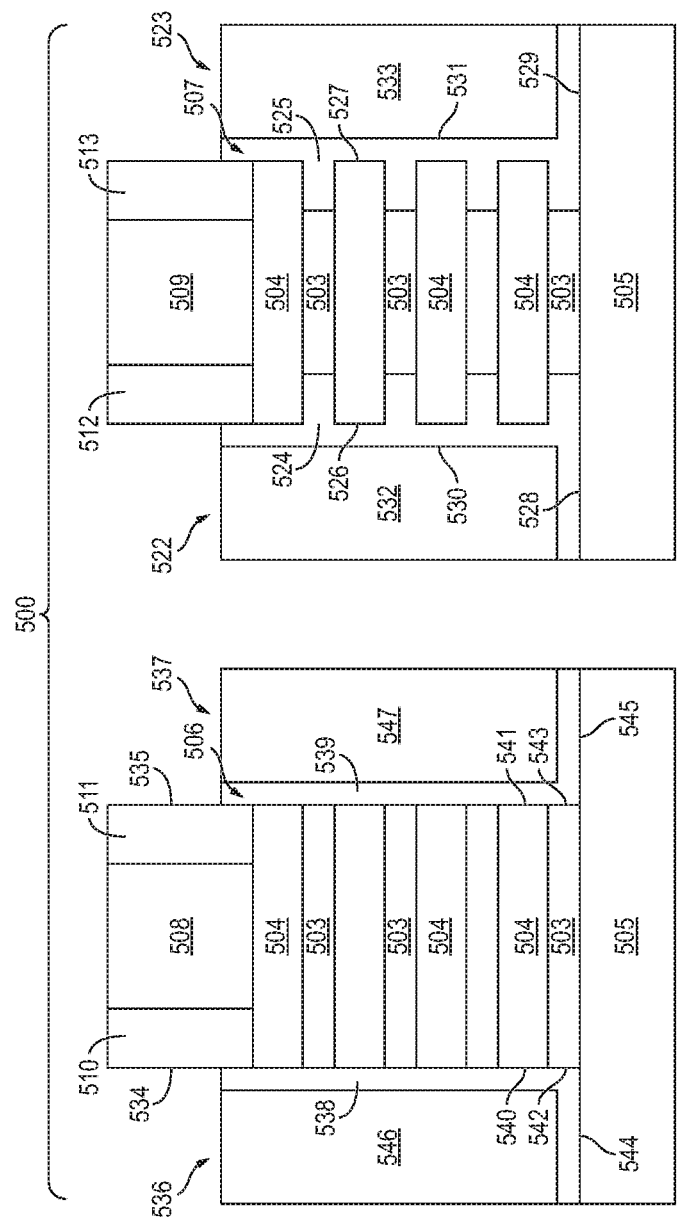

With reference now to FIG. 5B, the method also includes a task of forming source and drain regions 522, 523 for the second partial GAA FET (e.g., nFET source and drain regions or pFET source and drains) by, for example, epitaxial deposition. In the illustrated embodiment, the task of forming the source and drain regions 522, 523 for the second partial GAA FET includes forming source and drain buffer layers of undoped silicon 524, 525, respectively. In one or more embodiments, the source and drain buffer layers of undoped silicon 524, 525 have a thickness from approximately 0 nm to approximately 4 nm (e.g., a thickness from approximately 1 nm to approximately 3 nm). In the illustrated embodiment, the source and drain buffer layers of undoped silicon 524, 525 fill or substantially fill the recesses 516, 517 that were formed by the task of laterally etching the sacrificial layers 503, as described above with reference to FIG. 5A. Additionally, in the illustrated embodiment, the source and drain buffer layers 524, 525 form along vertical sidewalls 526, 527, respectively, of the channel layers 504 and along exposed portions 528, 529, respectively, of the substrate 505. Additionally, in the illustrated embodiment, outer edges 530, 531 of the source and drain buffer layers 524, 525, respectively, are vertical or substantially vertical along the fin 507.

In the illustrated embodiment, the task of forming the source and drain regions 522, 523 also includes a task of forming doped source and drain regions 532, 533 adjacent to the source and drain buffer layers 524, 525, respectively. In one or more embodiments in which the second partial GAA FET is an nFET, the doped source and drain regions 532, 533 may include SiP, SiCP, or any other suitable material known in the art. In one or more embodiments in which the second partial GAA FET is a pFET, the doped source and drain regions 532, 533 may include SiGeB, SiB, SiGeSnB, or any other suitable material known in the art.

With continued reference to FIGS. 5A-5B, the method also includes a task of removing the mask from the regions of the first partial GAA FET and masking the regions of the second partial GAA FET. The method also includes a task of etching regions of the one or more fins 506 of the first partial GAA FET not protected by the dummy gate 508 and the external sidewall spacers 510, 511. In one or more embodiments, the etching of the one or more fins 506 of the first partial GAA FET proceeds all the way down to, or into, the silicon substrate 505. In one or more embodiments, the etch of the one or more fins 506 of the first partial GAA FET is a vertical or substantially vertical recess etch and the recess etch is aligned or substantially aligned without outer edges, 534, 535 of the external sidewall spacers 510, 511, respectively.

In the illustrated embodiment, the method also includes a task of forming source and drain regions 536, 537 for the first partial GAA FET (e.g., nFET source and drain regions or pFET source and drains) by, for example, epitaxial deposition. In the illustrated embodiment, the task of forming the source and drain regions 536, 537 for the first partial GAA FET includes forming source and drain buffer layers of undoped silicon 538, 539, respectively. In one or more embodiments, the source and drain buffer layers of undoped silicon 538, 539 have a thickness from approximately 0 nm to approximately 4 nm (e.g., a thickness from approximately 1 nm to approximately 3 nm). In the illustrated embodiment, the source and drain buffer layers 538, 539 form along vertical sidewalls 540, 541, respectively, of the channel layers 504, along vertical sidewalls 542, 543, respectively, of the sacrificial layers 503, and along exposed portions 544, 545, respectively, of the substrate 505.

In the illustrated embodiment, the task of forming the source and drain regions 536, 537 also includes a task of forming doped source and drain regions 546, 547 adjacent to the source and drain buffer layers 538, 539, respectively. In one or more embodiments in which the first partial GAA FET is an nFET, the doped source and drain regions 546, 547 may include SiP, SiCP, or any other suitable material known in the art. In one or more embodiments in which the first partial GAA FET is a pFET, the doped source and drain regions 546, 547 may include SiGeB, SiB, SiGeSnB, or any other suitable material known in the art.

Figure 5C:
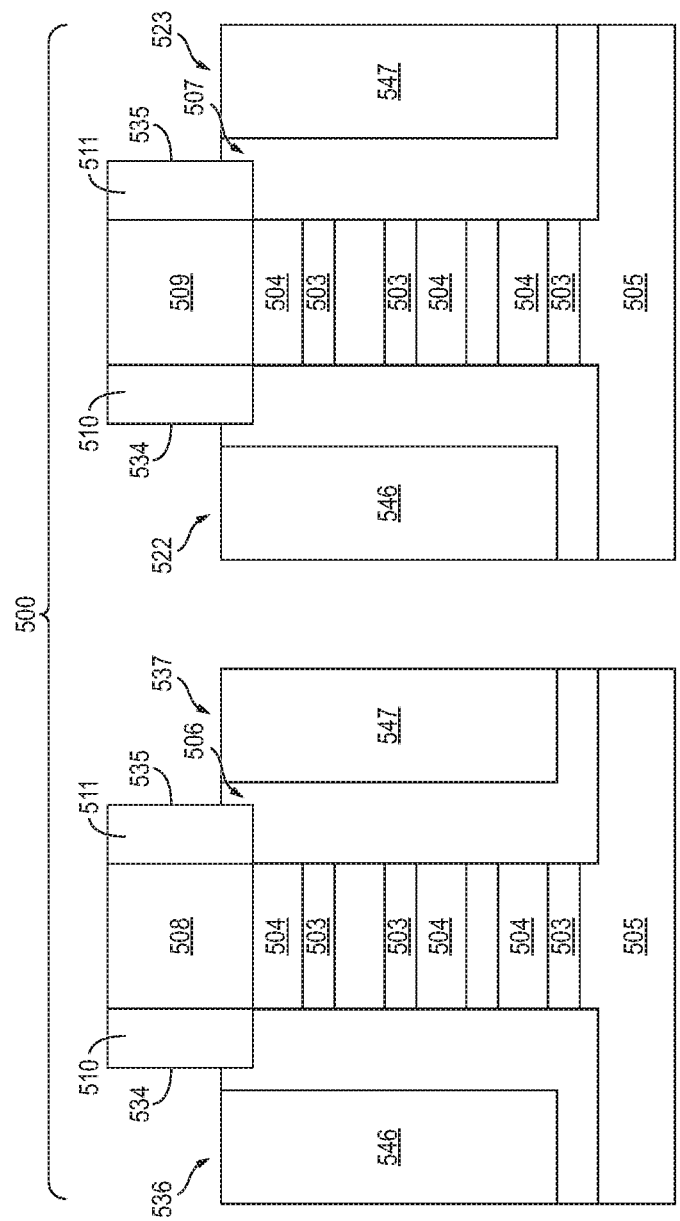

With reference now to FIG. 5C, the method according to one embodiment of the present disclosure also includes a task of annealing the source and drain regions 536, 537 and 522, 523 of the first and second partial GAA FETs, respectively, such that the source and drain buffer layers 538, 539 and 524, 525 are doped due to dopant diffusion.

Figure 5D:
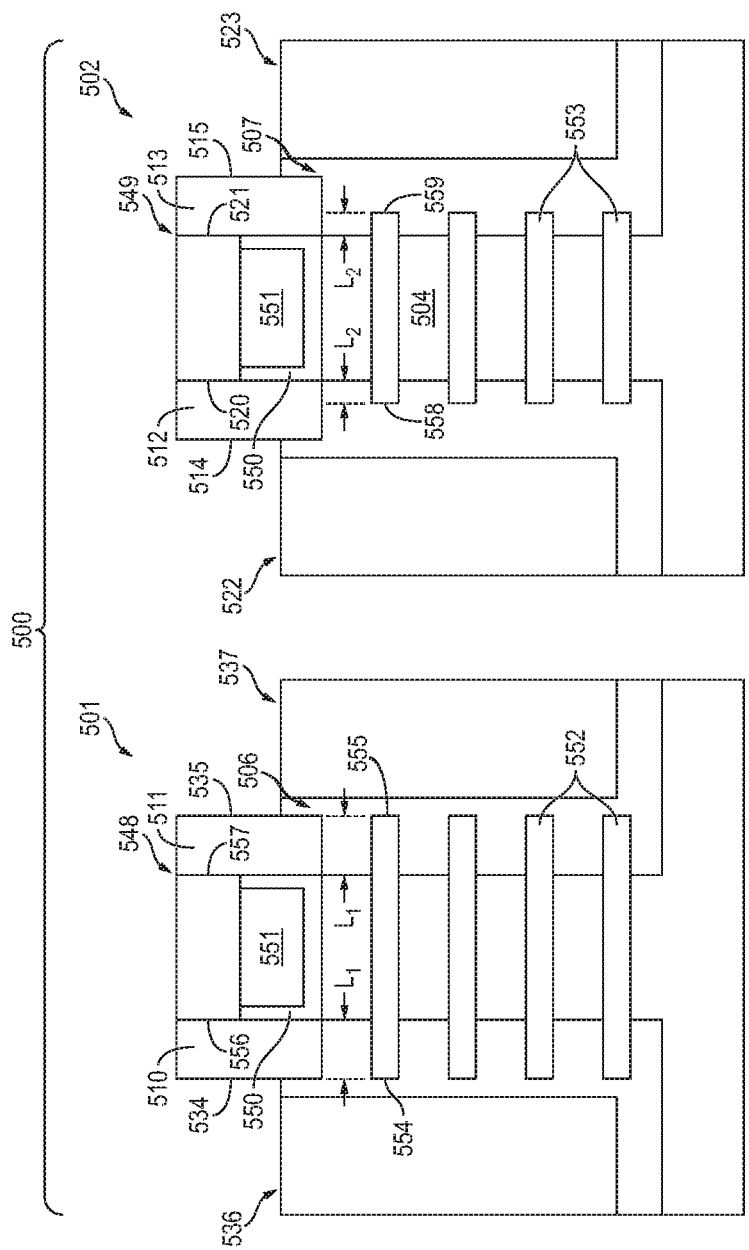

With reference now to FIG. 5D, the method according to one embodiment of the present disclosure also includes tasks of depositing an interlayer dielectric (ILD) on each of the dummy gate stacks 508, 509, performing chemical mechanical planarization (CMP) to a top of the dummy gate stacks 508, 509, and then removing the dummy gate stacks 508, 509 (e.g., by an etch) to expose the one or more fins 506, 507 of each of the first and second partial GAA FETs 501, 502. With continued reference to FIG. 5D, the method also includes a task of removing the sacrificial layers 503 (e.g., the SiGe sacrificial layers 503) by wet or dry etch that is selective with respect to the channel layers 504 (e.g., selective with respect to the Si channel layers 504). In one or more embodiments, the selective etching of the sacrificial layers 503 will not etch into the source and drain regions 522, 523, 536, 537 because the source and drain regions 522, 523, 536, 537 include an Si material adjacent to the sacrificial layers 503.

With continued reference to FIG. 5D, the method also includes forming gate stacks 548, 549 on the fins 506, 507, respectively, of the first and second partial GAA FETs 501, 502 by forming a gate dielectric layer 550 and then forming a metal layer 551 on the gate dielectric layer 550 by any process or processes known in the art, such as atomic-layer deposition (ALD). During the task of forming the gate stacks 548, 549, the gate dielectric layer 550, or a portion of the gate dielectric layer 550, fills the regions of the removed sacrificial layers 503 and forms dielectric separation layers 552, 553 (e.g., the gate dielectric layer 550, or a portion of the gate dielectric layer 550, fills the regions previously occupied by the sacrificial layers 503 and forms dielectric separation layers 552, 553). The gate dielectric layer 550 also forms over each of the one or more fins 506, 507 (e.g. the gate dielectric layer 550 forms along an upper surface of the uppermost channel layer 504 in each fin 506, 507). In the illustrated embodiment, the gate dielectric layers 550 form uniformly or substantially uniformly on all exposed surfaces. Since the gate dielectric layer 550, or a portion of the gate dielectric layer 550, fills the regions of the removed sacrificial layers 503, the metal layer 551 of the gate stacks 548, 549 does not deposit into the regions of the removed sacrificial layers 503. Accordingly, following the task of forming the gate stacks 548, 549, each of the fins 506, 507 includes a stack of two or more channel layers 504 (e.g., four channel layers 504) separated by the dielectric separation layers 552, 553, respectively (e.g., four dielectric separation layers 552, 553).

As illustrated in FIG. 5D, following the task of forming the gate stacks 548, 549 for the first and second partial GAA FETs 501, 502, the dielectric separation layers 553 of the second partial GAA FET 502 have a shorter length than the dielectric separation layers 552 of the first partial GAA FET 501. In the illustrated embodiment, a length $L_1$ is defined from outer edges 554, 555 of each of the dielectric separation regions 552 of the first partial GAA FET 501 to an inner surface 556, 557 of the respective sidewall spacer 510, 511 (e.g., the inner surface 556, 557 of the overlying sidewall spacer 510, 511). In the illustrated embodiment, the outer edges 554, 555 of each of the dielectric separation regions 552 are aligned or substantially aligned with the inner surface 556, 557 of the respective sidewall spacer 510, 511 such that the length $L_1$ of each of the dielectric separation regions 552 is equal or substantially equal to the width of the sidewall spacers 510, 511. Additionally, in the illustrated embodiment, a length $L_2$ is defined from outer edges 558, 559 of each of the dielectric separation regions 553 of the second partial GAA FET 502 to the inner surfaces 520, 521 of the respective sidewall spacer 512, 513 (e.g., the inner surface 520, 521 of the overlying sidewall spacer 512, 513). The length $L_2$ of the dielectric separation regions 553 of the second partial GAA FET 502 depends on the depth $D_1$ to which the sacrificial layers 503 were laterally etched during the task illustrated in FIG. 5A. In the illustrated embodiment, the length $L_1$ of the dielectric separation regions 552 of the first partial GAA FET 501 is greater than the length $L_2$ of the dielectric separation regions 553 of the second partial GAA FET 502. In one or more embodiments, the length $L_2$ of the dielectric separation regions 553 of the second partial GAA FET 502 may be from approximately 0 nm (e.g., the outer edges 558, 559 of the dielectric separation regions 553 are aligned or substantially aligned with the inner surface 520, 521 of the respective sidewall spacer 512, 513) to approximately 6 nm (e.g., from approximately 0 nm to approximately 3 nm).

The method also includes completing formation of the first and second partial GAA FETs 501, 502 and the CMOS SoC 500 including the partial GAA FETs 501, 502 by tasks known in the art, including CMP tasks to enable gate metal only in the removed dummy gate regions, followed by a task of contact formation, and a task of back-end-of-line (BEOL) formation.

In one or more embodiments, the method may include one or more tasks to achieve one or more of the features described above with reference to the embodiments illustrated in FIGS. 1-4. For instance, in one or more embodiments, the method may include a task of laterally etching both the sacrificial layers 503 and the conducting channel layers 504 of the second partial GAA FET 502 (e.g., as illustrated in the embodiment of the CMOS SoC 200 depicted in FIG. 2). In one or more embodiments, the method may include a task of forming the sidewall spacers 510, 511 and 512, 513 of the first and second partial GAA FETs 501, 502 with different widths. In one or more embodiments, the method may include a task of forming the sidewall spacers 510, 511 and 512, 513 such that the sidewall spacers 512, 513 of the second partial GAA FET 502 are relatively narrower than the sidewall spacers 510, 511 of the first partial GAA FET 501 (e.g., as illustrated in the embodiment of the CMOS SoC 300 depicted in FIG. 3). In one or more embodiments, the task of forming the sidewall spacers 510, 511 and 512, 513 with different widths may include forming the sidewall spacers 510, 511 and 512, 513 out of materials suitable to being subsequently thinned, such as, for example, nitride1 deposition, followed by oxide deposition, followed by nitride2 deposition, as is known in the art.

What is claimed is:

1. A CMOS system on chip, comprising:
a plurality of partial gate-all-around field effect transistors (GAA FETs), each partial GAA FET of the plurality of partial GAA FETs comprising:
a fin comprising a stack of channel regions, the stack comprising at least a first channel region and a second channel region stacked on the first channel region;
a source region and a drain region on opposite sides of the fin;
a dielectric separation region comprising a dielectric material between the first channel region and the second channel region;
a gate stack on the fin; and
a pair of sidewall spacers on opposite sides of the gate stack, wherein a portion of the dielectric separation region has a length from an outer edge of the dielectric separation region to an inner edge of a respective one of the pair of sidewall spacers, and
wherein the length of the portion of the dielectric separation region of one of the partial GAA FETs is different than the length of the portion of the dielectric separation region of another one of the partial GAA FETs.

2. The CMOS system on chip of claim 1, wherein the length of the portion of the dielectric separation region of the one of the partial GAA FETs is less than the length of the portion of the dielectric separation region of the another one of the partial GAA FETs.

3. The CMOS system on chip of claim 2, wherein the length of the portion of the dielectric separation region of the one of the partial GAA FETs is from approximately 0 nm to approximately 10 nm.

4. The CMOS system on chip of claim 2, wherein the length of the portion of the dielectric separation region of the one of the partial GAA FETs is from approximately 0 nm to approximately 6 nm.

5. The CMOS system on chip of claim 2, wherein the another one of the partial GAA FETs has a high voltage threshold or a regular voltage threshold, and wherein a capacitance of the another one of the partial GAA FETs is lower than a capacitance of the one of the partial GAA FETs.

6. The CMOS system on chip of claim 2, wherein the one of the partial GAA FETs has a low voltage threshold or a super low voltage threshold, and wherein a resistance of the one of the partial GAA FETs is lower than a resistance of the another one of the partial GAA FETs.

7. The CMOS system on chip of claim 1, wherein the pair of sidewall spacers of the one of the partial GAA FETs are thinner than the pair of sidewall spacers of the another one of the partial GAA FETs.

8. A field effect transistor, comprising:
a fin comprising a stack of channel regions, the stack comprising at least a first channel region and a second channel region stacked on the first channel region;
a source region and a drain region on opposite sides of the fin;
a dielectric separation region comprising a dielectric material between the first channel region and the second channel region;
a gate stack on the fin; and
a pair of sidewall spacers on opposite sides of the gate stack,
wherein an outer edge of the dielectric separation region is laterally between an inner surface and an outer surface of a respective one of the pair of sidewall spacers.

9. The field effect transistor of claim 8, wherein a portion of the dielectric separation region has a length from an outer edge of the dielectric separation region to an inner edge of a respective one of the sidewall spacers.

10. The field effect transistor of claim 9, wherein the length of the portion of the dielectric separation region is from approximately 0 nm to approximately 10 nm.

11. The field effect transistor of claim 9, wherein the length of the portion of the dielectric separation region is from approximately 0 nm to approximately 6 nm.

12. A method of manufacturing a CMOS system on chip comprising a plurality of partial gate-all-around field effect transistors (GAA FETs), the method comprising:
forming a first partial GAA FET of the plurality of partial GAA FETs; and
forming a second partial GAA FET of the plurality of partial GAA FETs,
wherein each of the first and second partial GAA FETs comprises:
a fin comprising a stack of channel regions, the stack comprising at least a first channel region and a second channel region stacked on the first channel region;
a source region and a drain region on opposite sides of the fin;
a dielectric separation region comprising a dielectric material between the first channel region and the second channel region;
a gate stack on the fin; and
a pair of sidewall spacers on opposite sides of the gate stack, wherein a portion of the dielectric separation region has a length from an outer edge of the dielectric separation region to an inner edge of a respective one of the pair of sidewall spacers, and
wherein the length of the portion of the dielectric separation region of the first partial GAA FET is different than the length of the portion of the dielectric separation region of the second partial GAA FET.

13. The method of claim 12, wherein the length of the portion of the dielectric separation region of the second partial GAA FET is less than the length of the portion of the dielectric separation region of the first partial GAA FET.

14. The method of claim 13, wherein the first partial GAA FET has a high voltage threshold or a regular voltage threshold, and a capacitance of the first partial GAA FET is lower than a capacitance of the second partial GAA FET.

15. The method of claim 13, wherein the second partial GAA FET has a low voltage threshold or a super low voltage threshold, and wherein a resistance of the second partial GAA FET is lower than a resistance of the first partial GAA FET.

16. The method of claim 13, wherein the length of the portion of the dielectric separation region of the second partial GAA FET is from approximately 0 nm to approximately 10 nm.

17. The method of claim 13, wherein the length of the portion of the dielectric separation region of the second partial GAA FET is from approximately 0 nm to approximately 6 nm.

18. The method of claim 12, wherein a length of doped extension regions of the first partial GAA FET is substantially the same as a length of doped extension regions of the second partial GAA FET.

19. The method of claim 12, wherein the pair of sidewall spacers of the second partial GAA FET are thinner than the pair of sidewall spacers of the first partial GAA FET.

20. The method of claim 12, wherein the forming the second partial GAA FET comprises:
depositing a stack of alternating sacrificial layers and conducting channel layers on a silicon substrate;
patterning and etching the stack to form at least one fin;
forming a dummy gate stack on the at least one fin;
forming external sidewall spacers on opposite sides of the dummy gate stack;
laterally etching opposite ends of each of the sacrificial layers; and
forming source and drain regions.

* * * * *